(12) United States Patent
Yen et al.

(10) Patent No.: US 11,450,730 B2
(45) Date of Patent: Sep. 20, 2022

(54) CROSSING STRUCTURE OF INTEGRATED TRANSFORMER AND INTEGRATED INDUCTOR

(71) Applicant: REALTEK SEMICONDUCTOR CORPORATION, Hsinchu (TW)

(72) Inventors: Hsiao-Tsung Yen, Hsinchu (TW); Hung-Yu Tsai, Nantou County (TW); Ka-Un Chan, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 273 days.

(21) Appl. No.: 16/744,233

(22) Filed: Jan. 16, 2020

(65) Prior Publication Data
US 2020/0343335 A1 Oct. 29, 2020

(30) Foreign Application Priority Data
Apr. 25, 2019 (TW) ................... 108114443

(51) Int. Cl.
*H01L 49/02* (2006.01)
*H01F 27/28* (2006.01)

(52) U.S. Cl.
CPC ......... *H01L 28/10* (2013.01); *H01F 27/2804* (2013.01); *H01F 2027/2809* (2013.01)

(58) Field of Classification Search
CPC ............... H01L 28/10; H01F 27/2804; H01F 2027/2809; H01F 2017/0046; H01F 17/0013
See application file for complete search history.

(56) References Cited

U.S. PATENT DOCUMENTS

| | | | |
|---|---|---|---|
| 6,472,285 B1 * | 10/2002 | Liou ................. | H01L 28/10 257/E21.022 |
| 9,799,722 B1 * | 10/2017 | Lu ..................... | H01L 23/5389 |
| 10,153,078 B2 | 12/2018 | Yen et al. | |
| 2004/0263308 A1 * | 12/2004 | Yu ..................... | H05K 1/165 336/200 |
| 2005/0190035 A1 * | 9/2005 | Wang ................ | H01F 17/0013 336/200 |
| 2015/0091687 A1 * | 4/2015 | Valentin ............ | H01L 23/5227 336/200 |
| 2015/0364243 A1 | 12/2015 | Yen et al. | |
| 2016/0099301 A1 * | 4/2016 | Yen .................. | H01F 17/0006 257/531 |
| 2017/0098500 A1 | 4/2017 | Yen et al. | |
| 2019/0148479 A1 * | 5/2019 | Yen .................. | H01L 23/5227 336/173 |
| 2019/0279809 A1 | 9/2019 | Yen | |
| 2019/0392980 A1 | 12/2019 | Yen | |
| 2020/0251550 A1 | 8/2020 | Yen | |
| 2020/0388570 A1 * | 12/2020 | Johnson ............ | H01F 27/292 |
| 2021/0202687 A1 * | 7/2021 | Luo .................. | H01F 27/2804 |
| 2021/0280668 A1 * | 9/2021 | Liao ................. | H01F 17/062 |

* cited by examiner

*Primary Examiner* — Douglas W Owens
(74) *Attorney, Agent, or Firm* — WPAT, PC (57) ABSTRACT

The invention discloses crossing structures of an integrated transformer or an integrated inductor. The crossing structures can be applied to various integrated transformers or integrated inductors. The crossing structures disclosed in the present invention includes multiple segments fabricated on a first metal layer of the semiconductor structure and multiple segments fabricated on a second metal layer of the semiconductor structure, the first metal layer being different from the second metal layer.

11 Claims, 14 Drawing Sheets

CROSSING STRUCTURE OF INTEGRATED TRANSFORMER AND INTEGRATED INDUCTOR

BACKGROUND OF THE INVENTION

1. Field of the Invention

The present invention generally relates to integrated transformers and integrated inductors, and, more particularly, to crossing structures of integrated transformers and integrated inductors.

2. Description of Related Art

Transformers are important elements in radio frequency (RF) integrated circuits to implement single-ended to differential signal conversion, signal coupling and impedance matching. As System-on-chips (SoC) become the mainstream of integrated circuits, integrated transformers and/or integrated inductors are gradually substituted for conventional discrete elements and are commonly applied to RF integrated circuits. However, transformers and inductors in integrated circuits often take up large areas; therefore, it becomes an important issue to reduce the areas of transformers and inductors in integrated circuits without degrading element performances, such as coupling coefficient (K) or quality factor (Q).

In particular, the crossing structure plays a key role in the winding or layout of integrated transformers and integrated inductors, as well as in the quality factor and symmetry.

SUMMARY OF THE INVENTION

In view of the issues of the prior art, an object of the present invention is to provide crossing structures of integrated transformers and integrated inductors, so as to make an improvement to the prior art.

A crossing structure applied to an integrated transformer is provided. The crossing structure includes a first segment, a second segment, a third segment, a fourth segment, a fifth segment a sixth segment and a seventh segment. The first segment, the second segment, the third segment, the fourth segment and the fifth segment are implemented on a first metal layer of a semiconductor structure. The sixth segment and the seventh segment are implemented on a second metal layer of the semiconductor structure. The sixth segment connects the first segment and the fifth segment through a plurality of through structures, and the first segment, the fifth segment and the seventh segment form a first trace. The seventh segment connects the second segment and the fourth segment through a plurality of through structures, and the second segment, the seventh segment and the fourth segment form a second trace. The first metal layer is different from the second metal layer. The integrated transformer includes a first inductor and a second inductor. The first trace and the third segment are part of the first inductor, and the second trace is part of the second inductor. The first trace crosses the second trace and the third segment, and the second trace crosses the third segment.

A crossing structure applied to an integrated transformer or an integrated inductor is also provided. The crossing structure includes a first segment, a second segment, a third segment, a fourth segment, a fifth segment, a sixth segment, a seventh segment and an eighth segment. The first segment, the second segment, the third segment, the fourth segment, the fifth segment and the sixth segment are implemented on a first metal layer of a semiconductor structure. The seventh segment and the eighth segment are implemented on a second metal layer of the semiconductor structure. The seventh segment connects the third segment and the fifth segment through a plurality of through structures, and the third segment, the fifth segment and the seventh segment form a first trace. The eighth segment connects the fourth segment and the sixth segment through a plurality of through structures, and the fourth segment, the sixth segment and the eighth segment form a second trace. The first metal layer is different from the second metal layer. The first trace crosses the first segment and the second segment, and the second trace crosses the first segment and the second segment.

A crossing structure applied to an integrated transformer or an integrated inductor is also provided. The crossing structure includes a first segment, a second segment, a third segment, a fourth segment, a fifth segment, a sixth segment, a seventh segment, an eighth segment, a ninth segment and a tenth segment. The first segment, the second segment, the third segment, the fourth segment, the fifth segment, the sixth segment and the seventh segment are implemented on a first metal layer of a semiconductor structure. The eighth segment, the ninth segment and the tenth segment are implemented on a second metal layer of the semiconductor structure. The eighth segment connects the first segment and the seventh segment through a plurality of through structures, and the first segment, the seventh segment and the eighth segment form a first trace. The ninth segment connects the second segment and the fifth segment through a plurality of through structures, and the second segment, the fifth segment and the ninth segment form a second trace. The tenth segment connects the third segment and the sixth segment through a plurality of through structures, and the third segment, the sixth segment and the tenth segment form a third trace. The first metal layer is different from the second metal layer. The first trace crosses the fourth segment, the second trace and the third trace. The second trace crosses the fourth segment. The third trace crosses the fourth segment.

The invention provides a variety of crossing structures which can be applied to a variety of integrated transformers or integrated inductors, making the design of integrated transformers or integrated inductors more flexible such that the demand for the coupling coefficient and/or quality factor can be met for various integrated transformers or integrated inductors.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly.

Figure 1A:
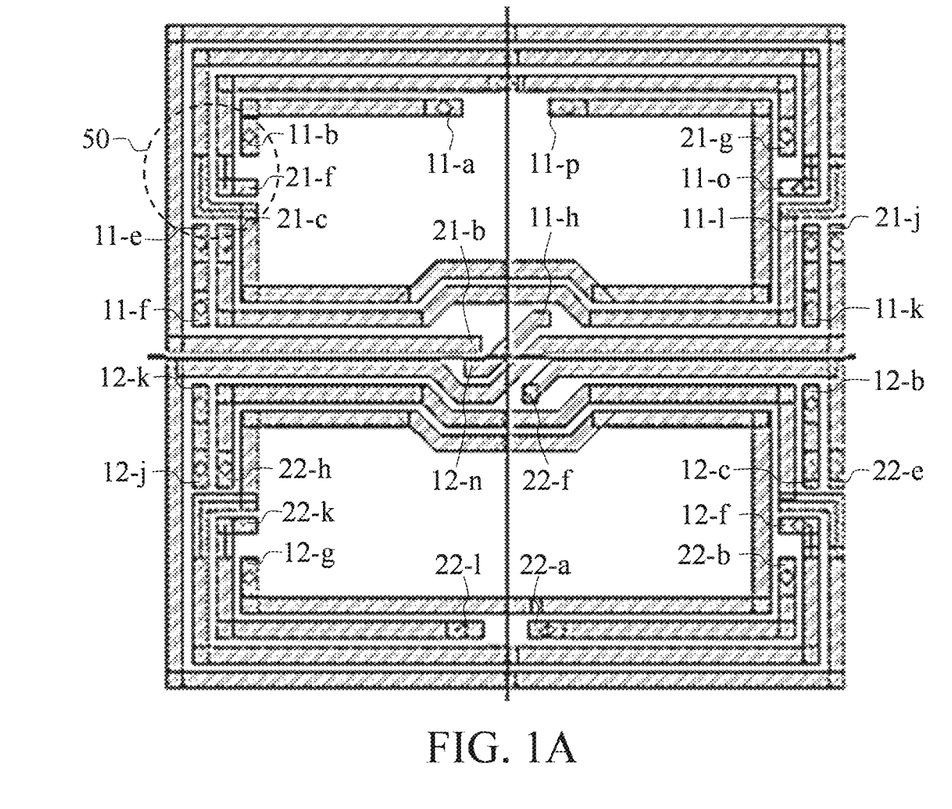
FIGS. 1A to 1B illustrate the structure of an integrated transformer according to an embodiment of the present invention.
Figure 1B:
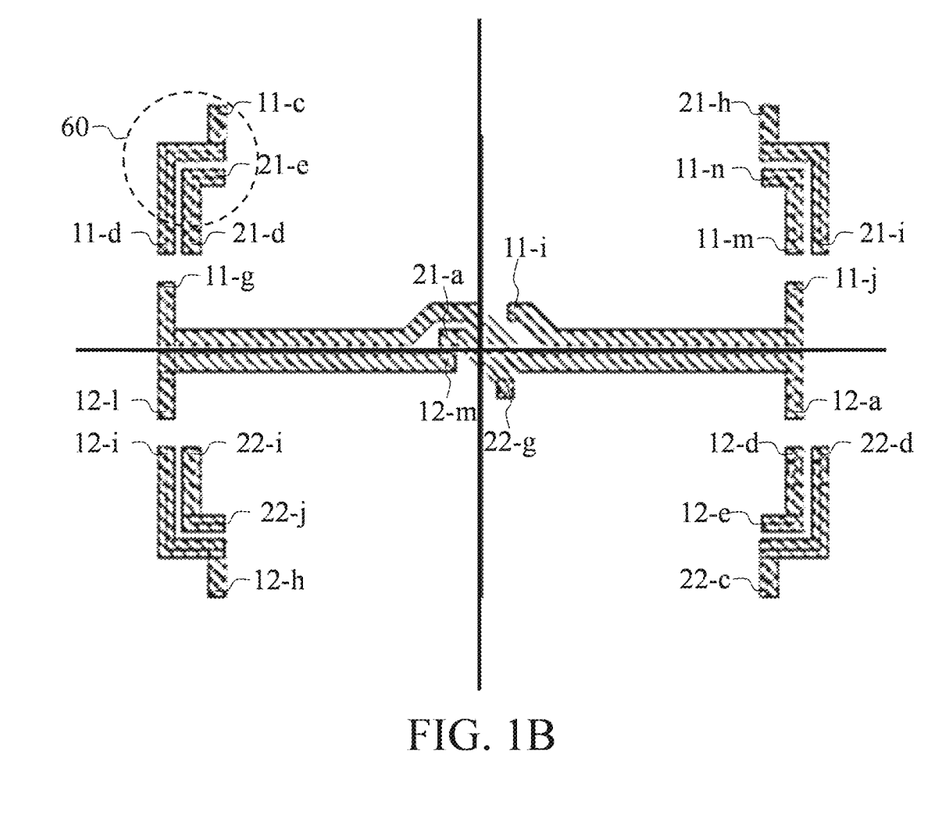

FIGS. 1A to 1B show the structure of an integrated transformer according to an embodiment of the present invention. The segments or traces in FIG. 1A are implemented on the first metal layer of the semiconductor structure, and the segments or traces in FIG. 1B are implemented on the second metal layer of the semiconductor structure. The second metal layer is different from the first metal layer. For example, the first metal layer can be the re-distribution layer (RDL) of the semiconductor structure, and the second metal layer can be the ultra-thick metal (UTM) layer of the semiconductor structure.

The integrated transformer of FIG. 1 (including FIGS. 1A and 1B) includes a first inductor and a second inductor. The end point 11-$a$ and end point 11-$p$ are the output/input terminals of the first inductor and form one of the ports of the integrated transformer. The end point 22-$a$ and end point 22-1 are the output/input terminals of the second inductor and form the other port of the integrated transformer.

Reference is made to FIGS. 1A and 1B. The end points 11-$b$ and 11-$c$ are connected. More specifically, the connected end points are connected through a through structure such as a via structure or a via array. Similarly, the end points 11-$d$ and 11-$e$ are connected; the end points 11-$f$ and 11-$g$ are connected; the end points 11-$h$ and 11-$i$ are connected; the end points 11-$j$ and 11-$k$ are connected; the end points 11-$l$ and 11-$m$ are connected; the end points 11-$n$ and 11-$o$ are connected; the end points 12-$a$ and 12-$b$ are connected; the end points 12-$c$ and 12-$d$ are connected; the end points 12-$e$ and 12-$f$ are connected; the end points 12-$g$ and 12-$h$ are connected; the end points 12-$i$ and 12-$j$ are connected; the end points 12-$k$ and 12-$l$ are connected; the end points 12-$m$ and 12-$n$ are connected; the end points 22-$b$ and 22-$c$ are connected; the end points 22-$d$ and 22-$e$ are connected; the end points 22-$f$ and 22-$g$ are connected; the end points 22-$h$ and 22-$i$ are connected; the end points 22-$j$ and 22-$k$ are connected; the end points 21-$a$ and 21-$b$ are connected; the end points 21-$c$ and 21-$d$ are connected; the end points 21-$e$ and 21-$f$ are connected; the end points 21-$g$ and 21-$h$ are connected; the end points 21-$i$ and 21-$j$ are connected.

For more details about the integrated transformer of FIG. 1, please refer to the similar structure came up with by the inventor of this instant application in U.S. patent application Ser. No. 16/742,960. Those having ordinary skill in the art can know other characteristics of the integrated transformer of this this instant application by referring to that patent application.

Figure 2A:
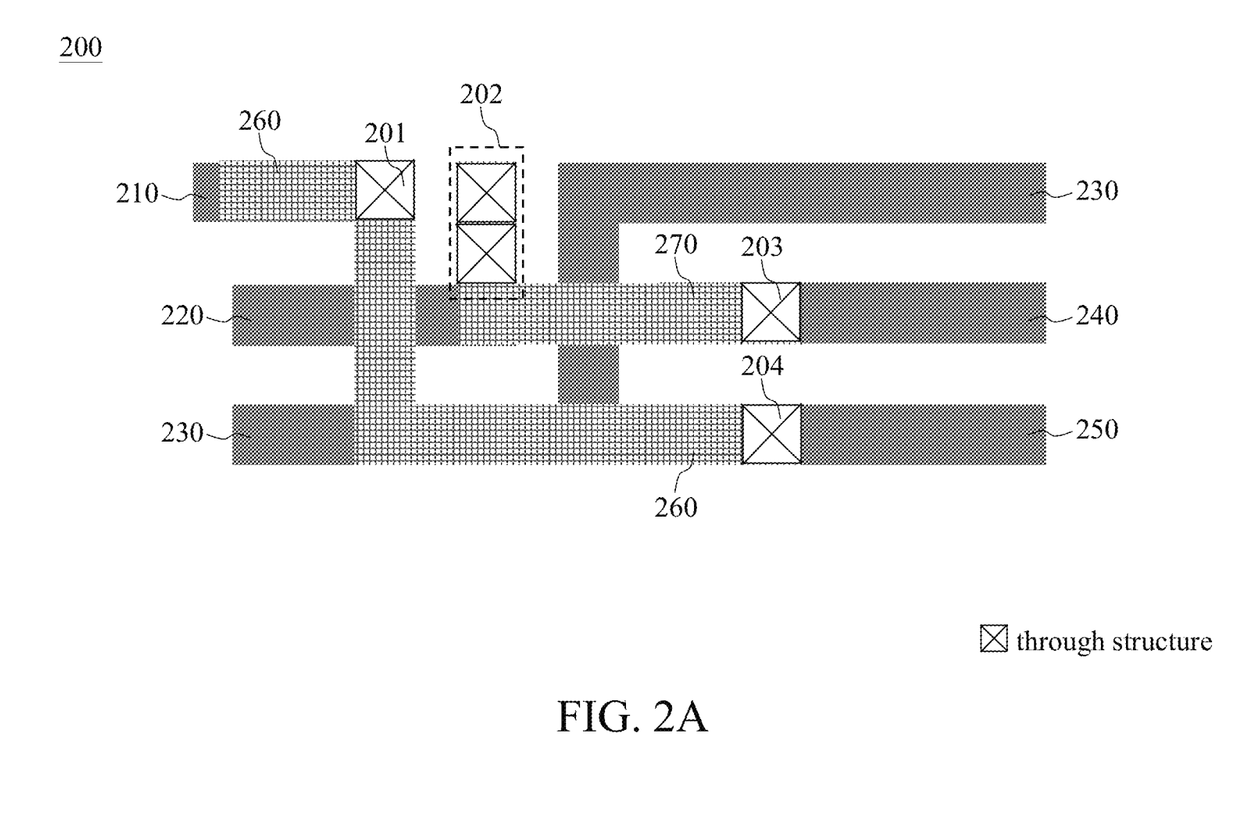
FIGS. 2A to 2C illustrate the layout of the crossing structure according to an embodiment of the present invention.
Figure 2B:
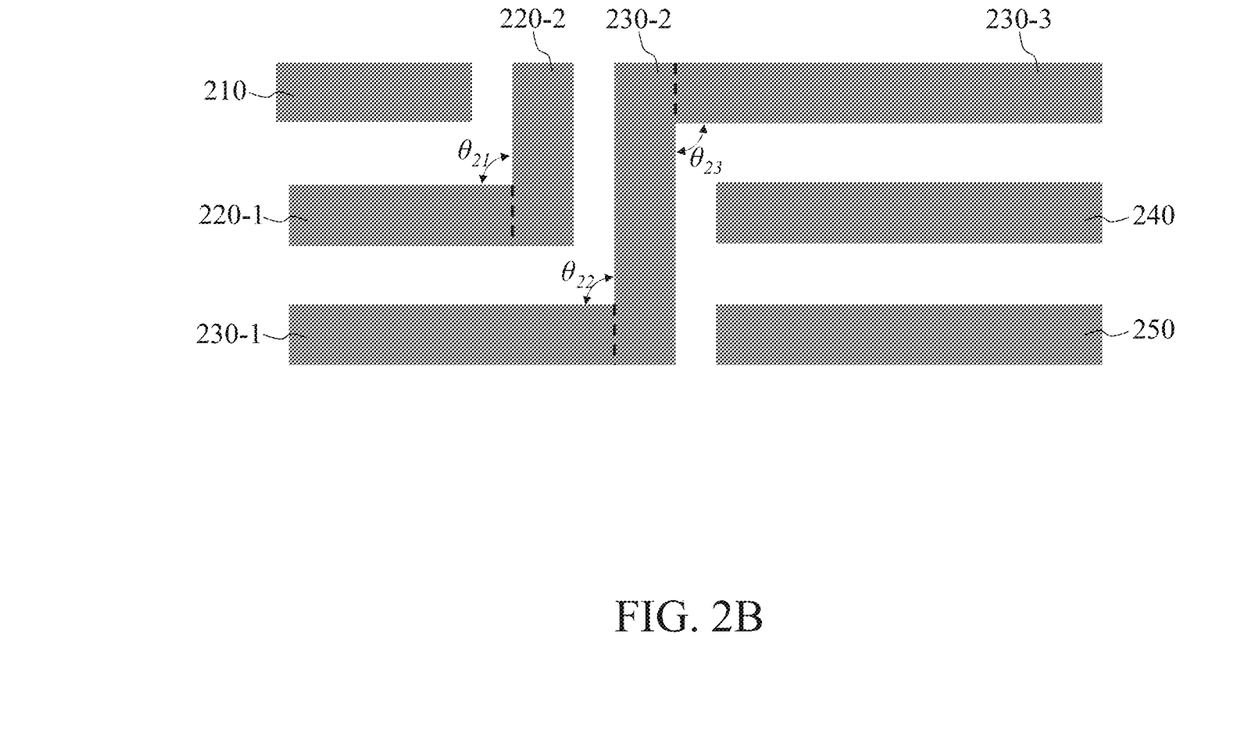
Figure 2C:
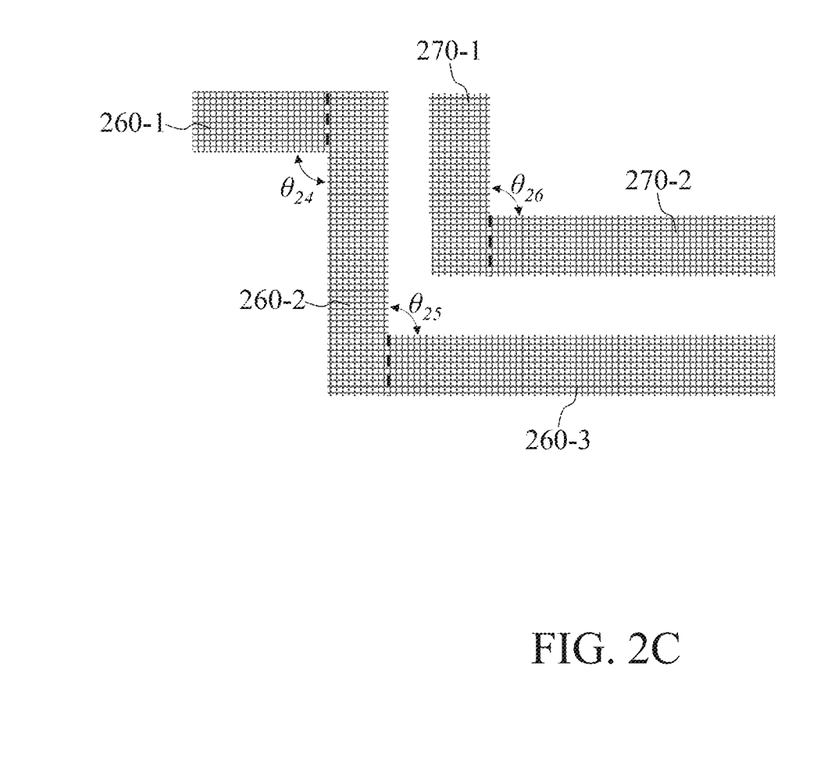

FIGS. 2A to 2C show the layout of the crossing structure according to an embodiment of the present invention. The crossing structure 200 corresponds to the area 50 in FIG. 1A and the area 60 in FIG. 1B. More specifically, the through structure 201 connects the end point 11-$b$ and the end point 11-$c$; the through structure 202 connects the end point 21-$e$ and the end point 21-$f$; the through structure 203 connects the end point 21-$c$ and the end point 21-$d$; and the through structure 204 connects the end point 11-$d$ and the end point 11-$e$. FIG. 2B shows one of the metal layers of the crossing structure 200, and FIG. 2C shows the other metal layer of the crossing structure 200.

As shown in FIGS. 2A to 2C, the crossing structure 200 includes a segment 210, a segment 220, a segment 230, a segment 240, a segment 250, a segment 260 and a segment 270. The segment 210, the segment 220, the segment 230, the segment 240 and the segment 250 are implemented on the first metal layer, and the segment 260 and the segment 270 are implemented on the second metal layer. The segment 220 includes a sub-segment 220-1 and a sub-segment 220-2. The segment 230 includes a sub-segment 230-1, a sub-segment 230-2 and a sub-segment 230-3. The segment 260 includes a sub-segment 260-1, a sub-segment 260-2 and a sub-segment 260-3. The segment 270 includes a sub-segment 270-1 and a sub-segment 270-2. The segment 260 connects the segment 210 and the segment 250 through the through structure 201 and the through structure 204, so that the segment 210, the segment 260 and the segment 250 form the first trace. Similarly, the segment 270 connects the segment 220 and the segment 240 through the through structure 202 and the through structure 203, so that the segment 220, the segment 270 and the segment 240 form the second trace.

The segment 260 crosses the segment 220 and the segment 230; in other words, the first trace crosses the second trace and the segment 230. The segment 270 crosses the segment 230; in other words, the second trace crosses the segment 230. Reference is made to both FIG. 1 and FIG. 2. The segment 230 and the first trace are part of the first inductor, and the second trace is part of the second inductor.

The segment 210, the sub-segment 220-1, the sub-segment 230-1, the sub-segment 230-3, the segment 240, the segment 250, the sub-segment 260-1, the sub-segment 260-3 and the sub-segment 270-2 are substantially parallel. The sub-segment 220-2, the sub-segment 230-2, the sub-segment 260-2 and the sub-segment 270-1 are substantially parallel.

Reference is made to FIG. 2B. The included angle $\theta_{21}$ between the sub-segment 220-1 and the sub-segment 220-2 is substantially 90 degrees. The included angle $\theta_{22}$ between the sub-segment 230-1 and the sub-segment 230-2 is substantially 90 degrees. The included angle $\theta_{23}$ between the sub-segment 230-2 and the sub-segment 230-3 is substantially 90 degrees.

Reference is made to FIG. 2C. The included angle $\theta_{24}$ between the sub-segment 260-1 and the sub-segment 260-2 is substantially 90 degrees. The included angle $\theta_{25}$ between the sub-segment 260-2 and the sub-segment 260-3 is substantially 90 degrees. The included angle $\theta_{26}$ between the sub-segment 270-1 and the sub-segment 270-2 is substantially 90 degrees.

Figure 3A:
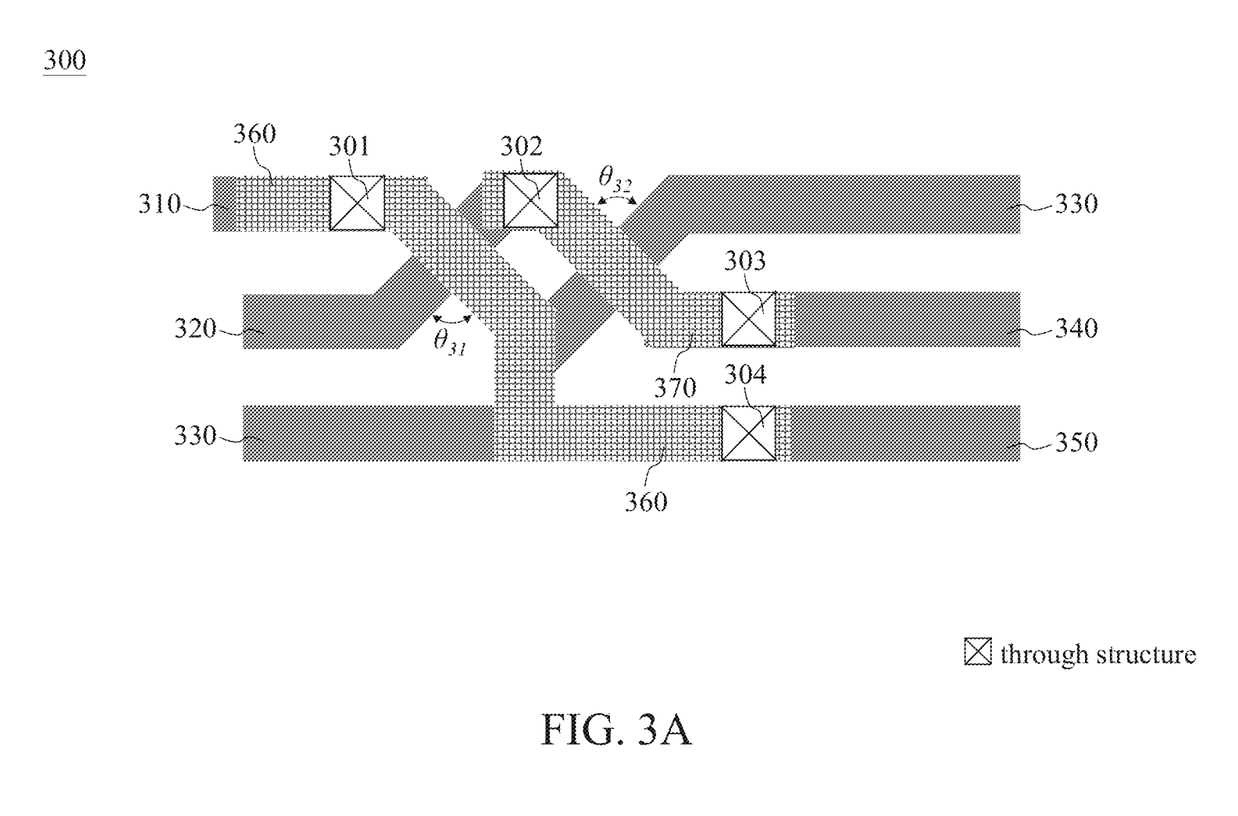
FIGS. 3A to 3C illustrate the layout of the crossing structure according to another embodiment of the present invention.
Figure 3B:
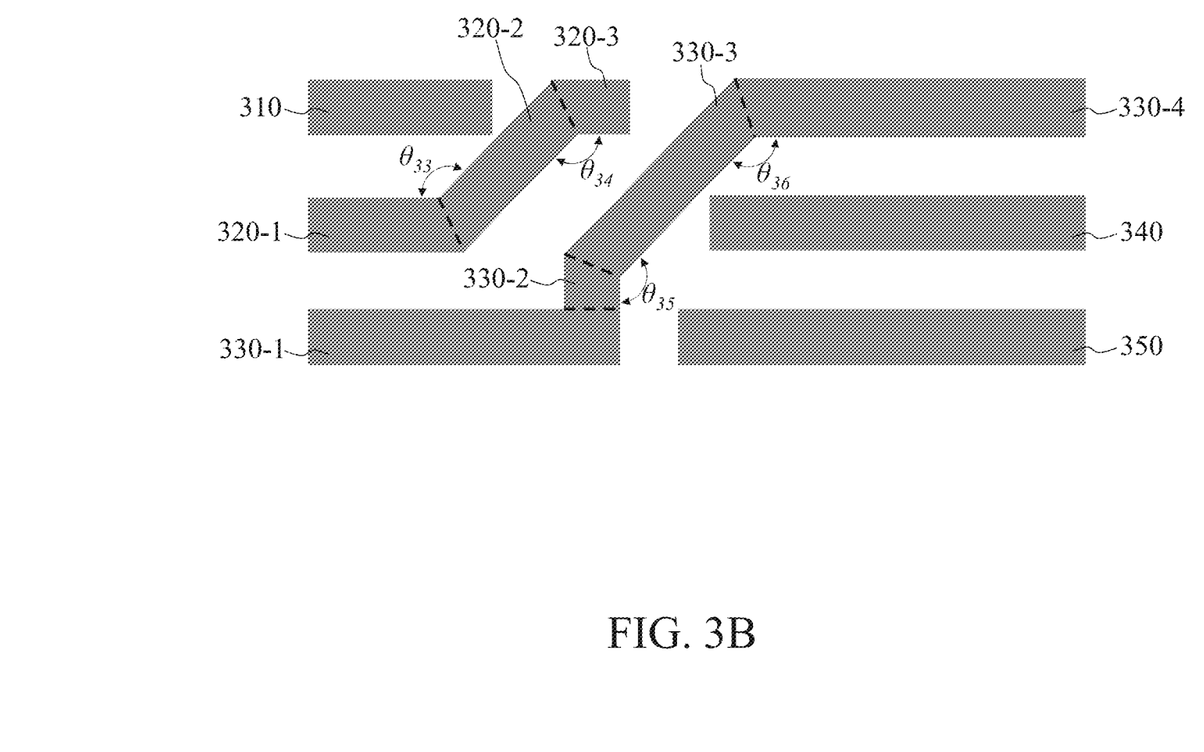
Figure 3C:
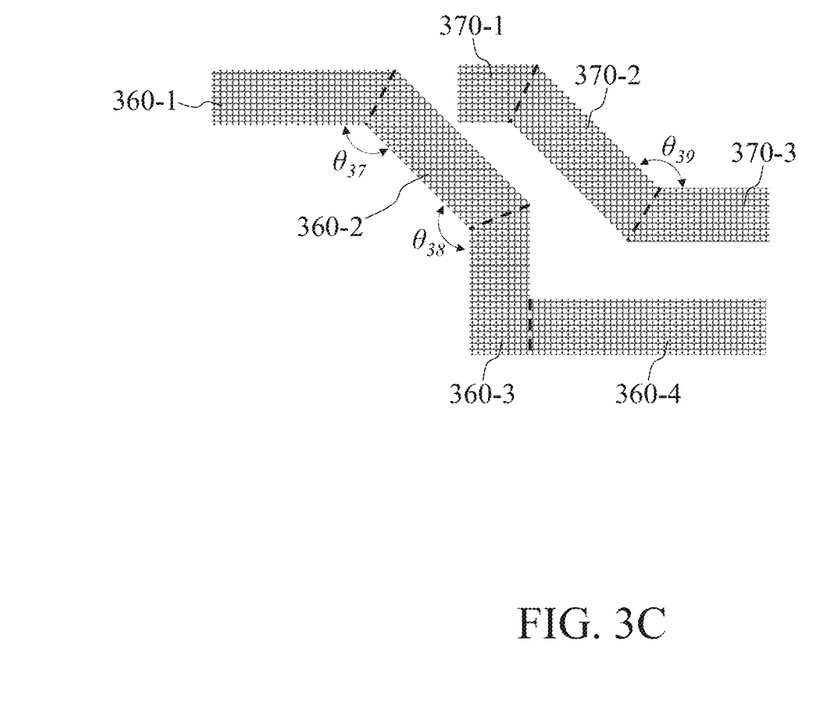

FIGS. 3A to 3C show the layout of the crossing structure according to another embodiment of the present invention. The crossing structure 300 corresponds to the area 50 in FIG. 1A and the area 60 in FIG. 1B. More specifically, the through structure 301 connects the end point 11-$b$ and the end point 11-$c$; the through structure 302 connects the end point 21-$e$ and the end point 21-$f$; the through structure 303 connects the end point 21-$c$ and the end point 21-$d$; and the through structure 304 connects the end point 11-$d$ and the end point 11-$e$. FIG. 3B shows one of the metal layers of the crossing structure 300, and FIG. 3C shows the other metal layer of the crossing structure 300.

As shown in FIGS. 3A to 3C, the crossing structure 300 includes a segment 310, a segment 320, a segment 330, a segment 340, a segment 350, a segment 360 and a segment 370. The segment 310, the segment 320, the segment 330, the segment 340 and the segment 350 are implemented on the first metal layer, and the segment 360 and the segment 370 are implemented on the second metal layer. The segment 320 includes a sub-segment 320-1, a sub-segment 320-2 and a sub-segment 320-3. The segment 330 includes a sub-segment 330-1, a sub-segment 330-2, a sub-segment 330-3 and a sub-segment 330-4. The segment 360 includes a sub-segment 360-1, a sub-segment 360-2, a sub-segment 360-3 and a sub-segment 360-4. The segment 370 includes a sub-segment 370-1, a sub-segment 370-2 and a sub-segment 370-3. The segment 360 connects the segment 310 and the segment 350 through the through structure 301 and the through structure 304, so that the segment 310, the segment 360 and the segment 350 form the first trace. Similarly, the segment 370 connects the segment 320 and the segment 340 through the through structure 302 and the through structure 303, so that the segment 320, the segment 370 and the segment 340 form the second trace.

The segment 360 crosses the segment 320 and the segment 330; in other words, the first trace crosses the second trace and the segment 330. The segment 370 crosses the segment 330; in other words, the second trace crosses the segment 330. Reference is made to both FIG. 1 and FIG. 3. The segment 330 and the first trace are part of the first inductor, and the second trace is part of the second inductor.

The segment 310, the sub-segment 320-1, the sub-segment 320-3, the sub-segment 330-1, the sub-segment 330-4, the segment 340, the segment 350, the sub-segment 360-1, the sub-segment 360-4, the sub-segment 370-1 and the sub-segment 370-3 are substantially parallel. The sub-segment 320-2 and the sub-segment 330-3 are substantially parallel. The sub-segment 360-2 and the sub-segment 370-2 are substantially parallel.

Reference is made to FIG. 3A. The included angle $\theta_{31}$ between the sub-segment 320-2 and the sub-segment 360-2 is substantially 90 degrees. The included angle $\theta_{32}$ between the sub-segment 330-3 and the sub-segment 370-2 is substantially 90 degrees.

Reference is made to FIG. 3B. The included angle $\theta_{33}$ between the sub-segment 320-1 and the sub-segment 320-2 is substantially 135 degrees. The included angle $\theta_{34}$ between the sub-segment 320-2 and the sub-segment 320-3 is substantially 135 degrees. The included angle $\theta_{35}$ between the sub-segment 330-2 and the sub-segment 330-3 is substantially 135 degrees. The included angle $\theta_{36}$ between the sub-segment 330-3 and the sub-segment 330-4 is substantially 135 degrees.

Reference is made to FIG. 3C. The included angle $\theta_{37}$ between the sub-segment 360-1 and the sub-segment 360-2 is substantially 135 degrees. The included angle $\theta_{38}$ between the sub-segment 360-2 and the sub-segment 360-3 is substantially 135 degrees. The included angle $\theta_{39}$ between the sub-segment 370-2 and the sub-segment 370-3 is substantially 135 degrees. Similarly, the included angle between the sub-segment 370-1 and the sub-segment 370-2 is substantially 135 degrees.

Figure 4A:
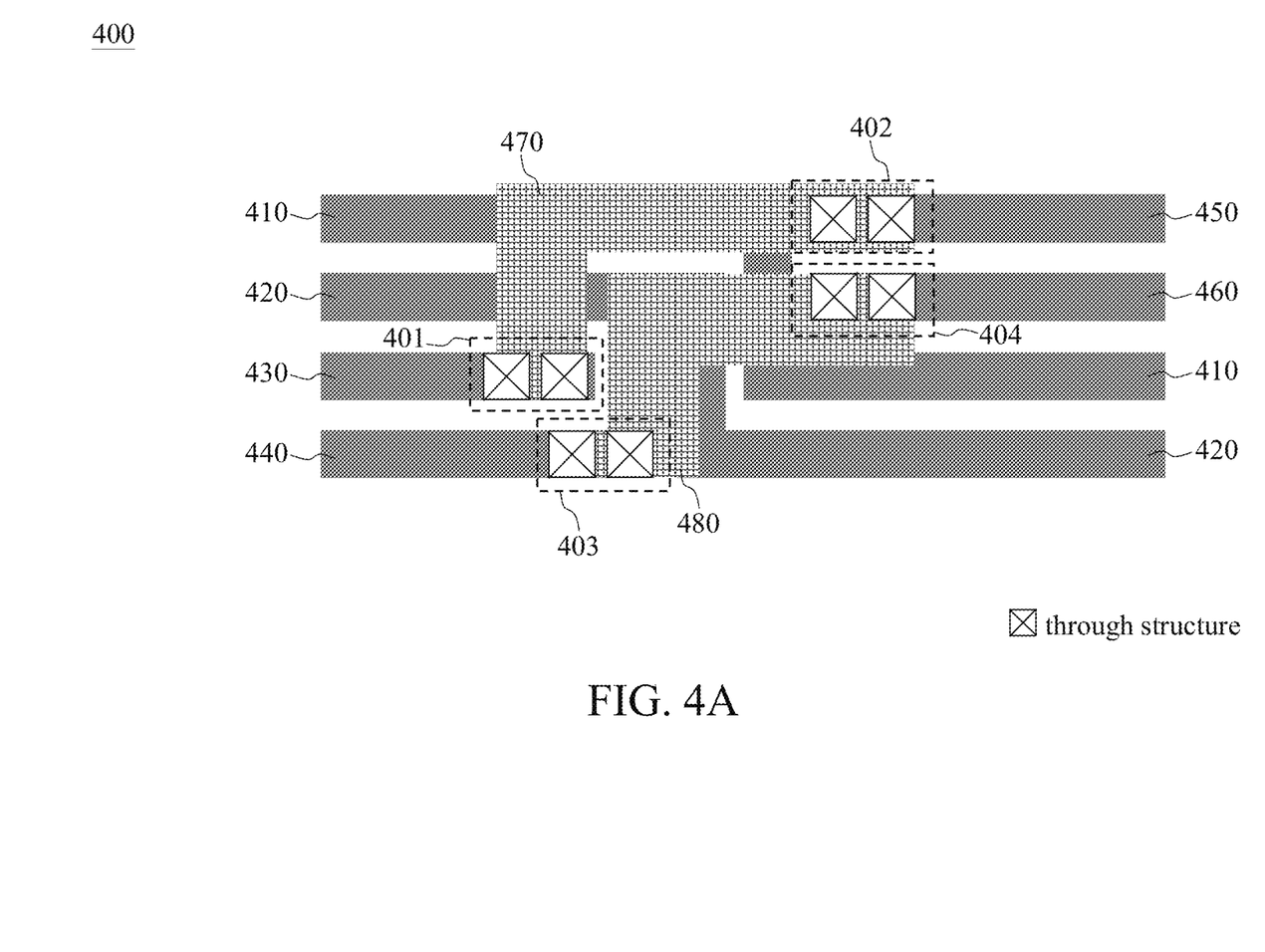
FIGS. 4A to 4C illustrate the layout of the crossing structure according to another embodiment of the present invention.
Figure 4B:
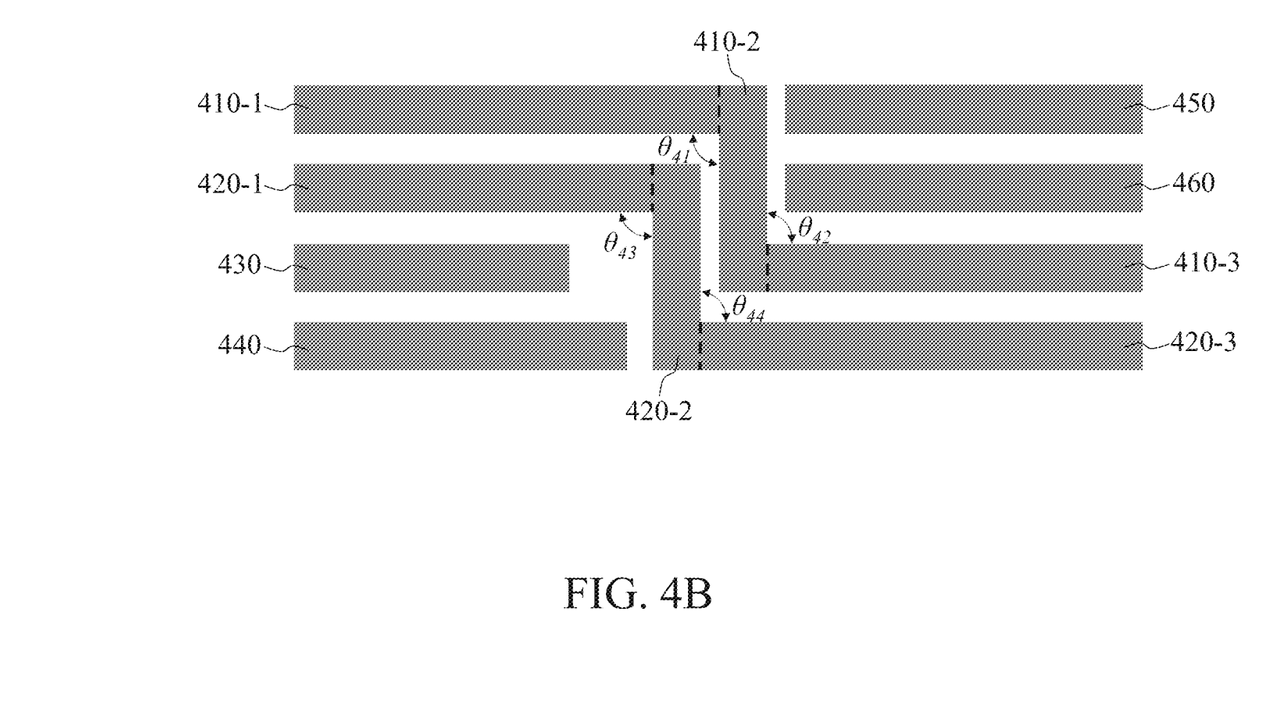
Figure 4C:
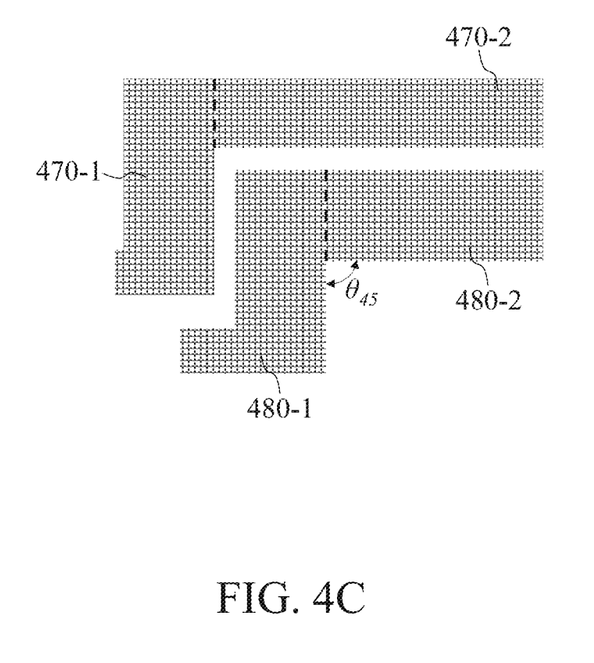

FIGS. 4A to 4C show the layout of the crossing structure according to another embodiment of the present invention. FIG. 4A shows the complete crossing structure 400. FIG. 4B shows one of the metal layers of the crossing structure 400, and FIG. 4C shows the other metal layer of the crossing structure 400.

As shown in FIGS. 4A to 4C, the crossing structure 400 includes a segment 410, a segment 420, a segment 430, a segment 440, a segment 450, a segment 460, a segment 470 and a segment 480. The segment 410, the segment 420, the segment 430, the segment 440, the segment 450, the segment 460 are implemented on the first metal layer, and the segment 470 and the segment 480 are implemented on the second metal layer. The segment 410 includes a sub-segment 410-1, a sub-segment 410-2 and a sub-segment 410-3. The segment 420 includes a sub-segment 420-1, a sub-segment 420-2 and a sub-segment 420-3. The segment 470 includes a sub-segment 470-1 and a sub-segment 470-2. The segment 480 includes a sub-segment 480-1 and a sub-segment 480-2. The segment 470 connects the segment 430 and the segment 450 through the through structure 401 and the through structure 402, so that the segment 430, the segment 470 and the segment 450 form the first trace. Similarly, the segment 480 connects the segment 440 and the segment 460 through the through structure 403 and the through structure 404, so that the segment 440, the segment 480 and the segment 460 form the second trace.

The segment 470 crosses the segment 410 and the segment 420; in other words, the first trace crosses the segment 410 and the segment 420. The segment 480 crosses the segment 410 and the segment 420; in other words, the second trace crosses the segment 410 and the segment 420. The sub-segment 410-1, the sub-segment 410-3, the sub-segment 420-1, the sub-segment 420-3, the segment 430, the segment 440, the segment 450, the segment 460, the sub-segment 470-2 and the sub-segment 480-2 are substantially parallel. The sub-segment 410-2, the sub-segment 420-2, the sub-segment 470-1 and the sub-segment 480-1 are substantially parallel.

In some embodiments, the crossing structure 400 may be applied to an integrated transformer or an integrated inductor. FIG. 4A shows the first, second, third and fourth turns (from top to bottom) of the integrated transformer or integrated inductor. More specifically, the sub-segment 410-1, the segment 450 and the sub-segment 470-2 are part of the first turn; the sub-segment 420-1, the segment 460 and the sub-segment 480-2 are part of the second turn; the segment 430 and the sub-segment 410-3 are part of the third turn; and the segment 440 and the sub-segment 420-3 are part of the fourth turn. The segment 470 and the sub-segment 410-2 are utilized to connect the first turn and the third turn. The segment 480 and the sub-segment 420-2 are utilized to connect the second turn and the fourth turn.

Reference is made to FIG. 4B. The included angle $\theta_{41}$ between the sub-segment 410-1 and the sub-segment 410-2 is substantially 90 degrees. The included angle $\theta_{42}$ between the sub-segment 410-2 and the sub-segment 410-3 is substantially 90 degrees. The included angle $\theta_{43}$ between the sub-segment 420-1 and the sub-segment 420-2 is substantially 90 degrees. The included angle $\theta_{44}$ between the sub-segment 420-2 and the sub-segment 420-3 is substantially 90 degrees.

Reference is made to FIG. 4C. The included angle $\theta_{45}$ between the sub-segment 480-1 and the sub-segment 480-2 is substantially 90 degrees. Similarly, the included angle between the sub-segment 470-1 and the sub-segment 470-2 is substantially 90 degrees.

Figure 5A:
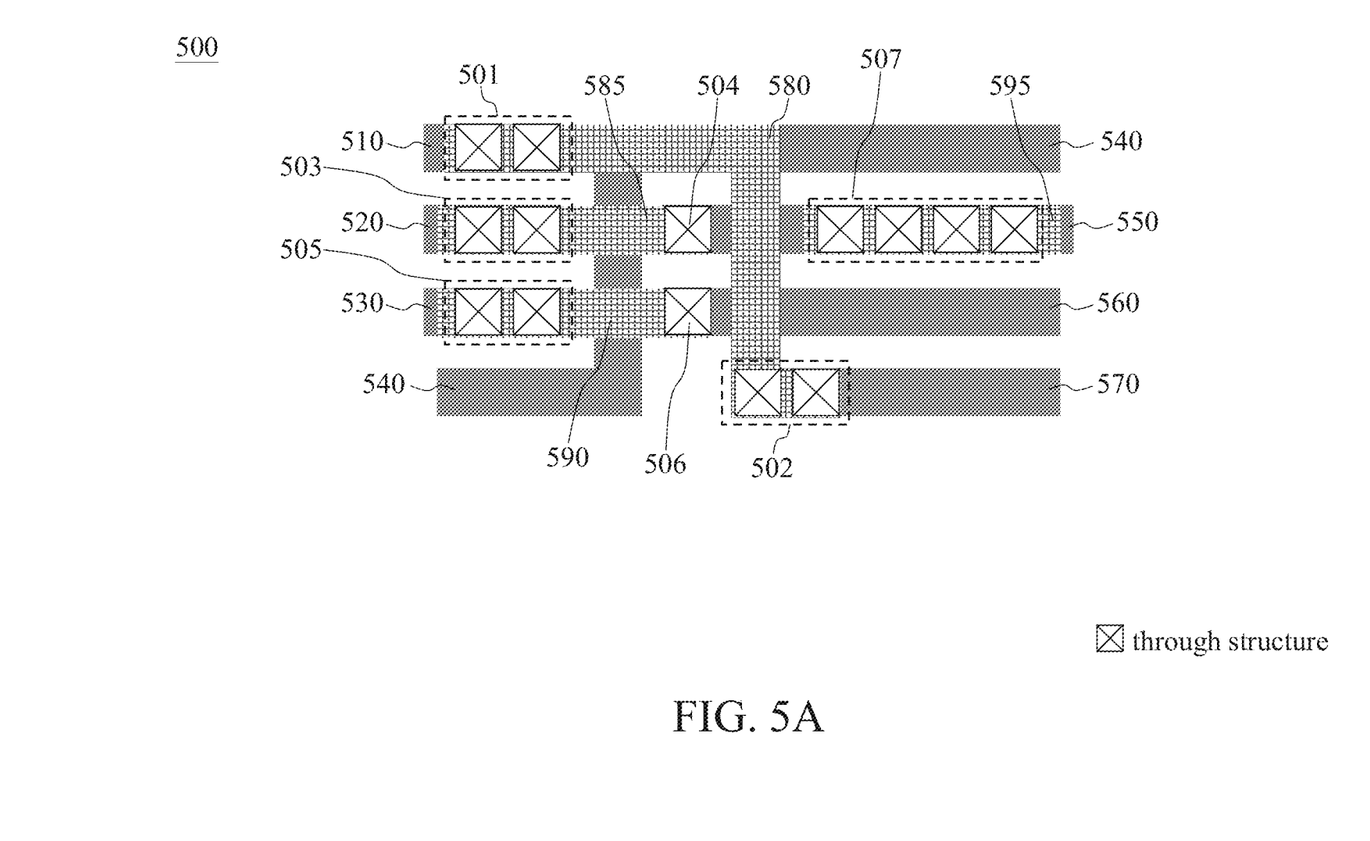
FIGS. 5A to 5C illustrate the layout of the crossing structure according to another embodiment of the present invention.
Figure 5B:
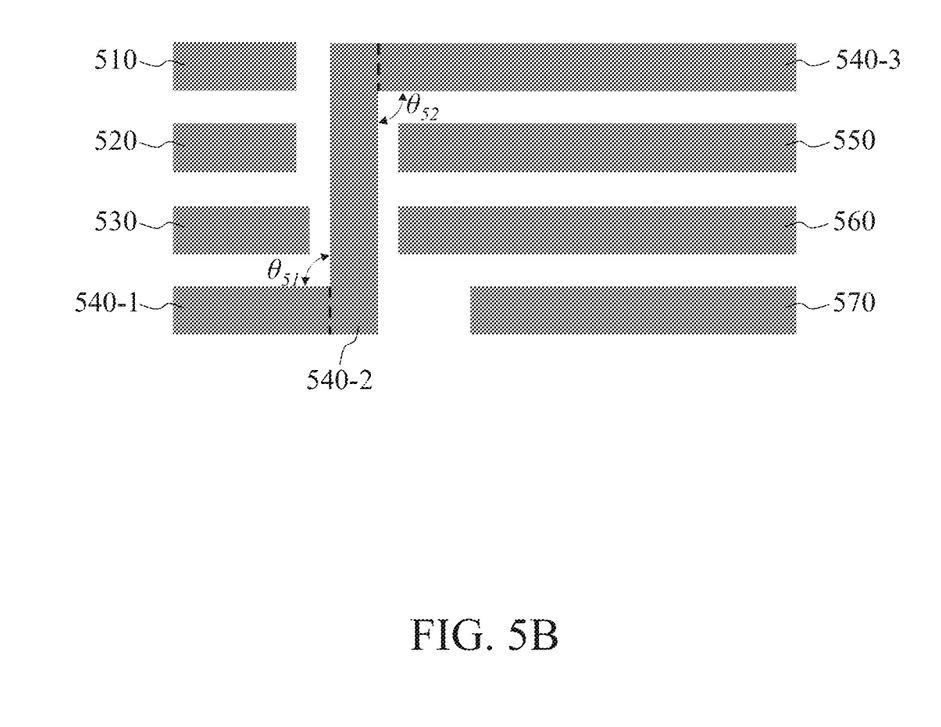
Figure 5C:
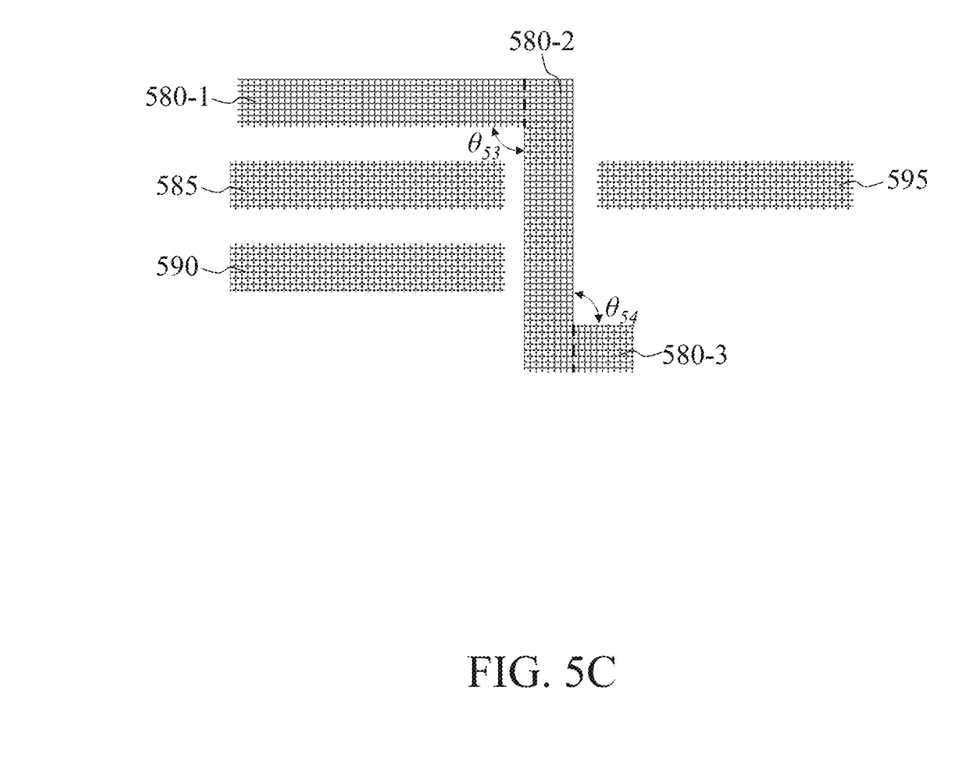

FIGS. 5A to 5C show the layout of the crossing structure according to another embodiment of the present invention. FIG. 5A shows the complete crossing structure 500. FIG. 5B shows one of the metal layers of the crossing structure 500, and FIG. 5C shows the other metal layer of the crossing structure 500.

As shown in FIGS. 5A to 5C, the crossing structure 500 includes a segment 510, a segment 520, a segment 530, a segment 540, a segment 550, a segment 560, a segment 570, a segment 580, a segment 585, a segment 590 and a segment 595. The segment 510, the segment 520, the segment 530, the segment 540, the segment 550, the segment 560 and the segment 570 are implemented on the first metal layer, and the segment 580, the segment 585, the segment 590 and the segment 595 are implemented on the second metal layer. The segment 540 includes a sub-segment 540-1, a sub-segment 540-2 and a sub-segment 540-3. The segment 580 includes a sub-segment 580-1, a sub-segment 580-2 and a sub-segment 580-3. The segment 580 connects the segment 510 and the segment 570 through the through structure 501 and the through structure 502, so that the segment 510, the segment 580 and the segment 570 form the first trace. Similarly, the segment 585 connects the segment 520 and the segment 550 through the through structure 503 and the through structure 504, so that the segment 520, the segment 585 and the segment 550 form the second trace. Similarly, the segment 590 connects the segment 530 and the segment 560 through the through structure 505 and the through structure 506, so that the segment 530, the segment 590 and the segment 560 form the third trace. The segment 595 and the segment 550 are connected through the through structure 507.

The segment 580 crosses the segment 540, the segment 550 and the segment 560; in other words, the first trace crosses the segment 540, the second trace and the third trace. The segment 585 crosses the segment 540; in other words, the second trace crosses the segment 540. The segment 590 crosses the segment 540; in other words, the third trace crosses the segment 540. The segment 510, the segment 520, the segment 530, the sub-segment 540-1, the sub-segment 540-3, the segment 550, the segment 560, the segment 570, the sub-segment 580-1, the sub-segment 580-3, the segment 585, the segment 590 and the segment 595 are substantially parallel. The sub-segment 540-2 and the sub-segment 580-2 are substantially parallel.

In some embodiments, the crossing structure 500 may be applied to an integrated transformer or an integrated inductor. FIG. 5A shows the first, second, third and fourth turns (from top to bottom) of the integrated transformer or integrated inductor. More specifically, the segment 510, the sub-segment 540-3 and the sub-segment 580-1 are part of the first turn; the segment 520, the segment 550, the segment 585 and the segment 595 are part of the second turn; the segment 530, the segment 560 and the segment 590 are part of the third turn; and the sub-segment 540-1, the segment 570 and the sub-segment 580-3 are part of the fourth turn. The segment 580 and the sub-segment 540-2 are utilized to connect the first turn and the fourth turn.

Reference is made to both FIGS. 5B and 5C. The included angle $\theta_{51}$ between the sub-segment 540-1 and the sub-segment 540-2 is substantially 90 degrees. The included angle $\theta_{52}$ between the sub-segment 540-2 and the sub-segment 540-3 is substantially 90 degrees. The included angle $\theta_{53}$ between the sub-segment 580-1 and the sub-segment 580-2 is substantially 90 degrees. The included angle $\theta_{54}$ between the sub-segment 580-2 and the sub-segment 580-3 is substantially 90 degrees.

Please note that the shape, size, and ratio of any element in the disclosed figures are exemplary for understanding, not for limiting the scope of this invention. The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A crossing structure applied to an integrated transformer, comprising:
   a first segment, a second segment, a third segment, a fourth segment and a fifth segment, wherein the first segment, the second segment, the third segment, the fourth segment and the fifth segment are implemented on a first metal layer of a semiconductor structure; and
   a sixth segment and a seventh segment, wherein the sixth segment and the seventh segment are implemented on a second metal layer of the semiconductor structure;
   wherein the sixth segment connects the first segment and the fifth segment through a plurality of through structures, and the first segment, the fifth segment and the sixth segment form a first trace;
   wherein the seventh segment connects the second segment and the fourth segment through a plurality of through structures, and the second segment, the seventh segment and the fourth segment form a second trace; and
   wherein the first metal layer is different from the second metal layer, the integrated transformer comprises a first inductor and a second inductor, the first trace and the third segment are part of the first inductor, the second trace is part of the second inductor, the first trace crosses the second trace and the third segment, and the second trace crosses the third segment.

2. The crossing structure of claim 1, wherein the sixth segment comprises a first sub-segment and a second sub-segment, and an included angle between the first sub-segment and the second sub-segment is substantially 90 degrees.

3. The crossing structure of claim 2, wherein the third segment comprises a third sub-segment and a fourth sub-segment, the first sub-segment is substantially parallel to the third sub-segment, and the second sub-segment is substantially parallel to the fourth sub-segment.

4. The crossing structure of claim 1, wherein the sixth segment comprises a first sub-segment and a second sub-segment, and an included angle between the first sub-segment and the second sub-segment is substantially 135 degrees.

5. The crossing structure of claim 4, wherein the second segment comprises a third sub-segment, the third segment comprises a fourth sub-segment, the seventh segment comprises a fifth sub-segment, the first sub-segment is substantially perpendicular to the third sub-segment, and the fourth sub-segment is substantially perpendicular to the fifth sub-segment.

6. A crossing structure applied to an integrated transformer or an integrated inductor, comprising:
   a first segment, a second segment, a third segment, a fourth segment, a fifth segment and a sixth segment, wherein the first segment, the second segment, the third segment, the fourth segment, the fifth segment and the sixth segment are implemented on a first metal layer of a semiconductor structure; and
   a seventh segment and an eighth segment, wherein the seventh segment and the eighth segment are implemented on a second metal layer of the semiconductor structure;
   wherein the seventh segment connects the third segment and the fifth segment through a plurality of through structures, and the third segment, the fifth segment and the seventh segment form a first trace;
   wherein the eighth segment connects the fourth segment and the sixth segment through a plurality of through structures, and the fourth segment, the sixth segment and the eighth segment form a second trace; and
   wherein the first metal layer is different from the second metal layer, the first trace crosses the first segment and the second segment, and the second trace crosses the first segment and the second segment.

7. The crossing structure of claim 6, wherein the integrated transformer or the integrated inductor comprises a first turn, a second turn, a third turn and a fourth turn in sequence, the seventh segment is utilized to connect the first turn and the third turn, and the eighth segment is utilized to connect the second turn and the fourth turn.

8. The crossing structure of claim 6, wherein the seventh segment comprises a first sub-segment and a second sub-segment, and an included angle between the first sub-segment and the second sub-segment is substantially 90 degrees.

9. A crossing structure applied to an integrated transformer or an integrated inductor, comprising:
- a first segment, a second segment, a third segment, a fourth segment, a fifth segment, a sixth segment and a seventh segment, wherein the first segment, the second segment, the third segment, the fourth segment, the fifth segment, the sixth segment and the seventh segment are implemented on a first metal layer of a semiconductor structure; and
- an eighth segment, a ninth segment and a tenth segment, wherein the eighth segment, the ninth segment and the tenth segment are implemented on a second metal layer of the semiconductor structure;
- wherein the eighth segment connects the first segment and the seventh segment through a plurality of through structures, and the first segment, the seventh segment and the eighth segment form a first trace;
- wherein the ninth segment connects the second segment and the fifth segment through a plurality of through structures, and the second segment, the fifth segment and the ninth segment form a second trace;
- wherein the tenth segment connects the third segment and the sixth segment through a plurality of through structures, and the third segment, the sixth segment and the tenth segment form a third trace; and
- wherein the first metal layer is different from the second metal layer, the first trace crosses the fourth segment, the second trace and the third trace, the second trace crosses the fourth segment, and the third trace crosses the fourth segment.

10. The crossing structure of claim 9, wherein the integrated transformer or the integrated inductor comprises a first turn, a second turn, a third turn and a fourth turn in sequence, the eighth segment is utilized to connect the first turn and the fourth turn.

11. The crossing structure of claim 9, wherein the eighth segment comprises a first sub-segment and a second sub-segment, and an included angle between the first sub-segment and the second sub-segment is substantially 90 degrees.

* * * * *